(12) United States Patent
Dariavach et al.

(10) Patent No.: US 9,999,160 B1
(45) Date of Patent: Jun. 12, 2018

(54) METHOD AND SYSTEM FOR AIR CONTAMINATION ANALYSIS FOR FREE AIR COOLED DATA CENTERS

(71) Applicant: EMC Corporation, Hopkinton, MA (US)

(72) Inventors: Nader G. Dariavach, Milford, MA (US); Jin Liang, Southborough, MA (US); Francis William French, Harvard, MA (US); Gordon O. Barr, Fall River, MA (US); Paul T. Callahan, Acton, MA (US)

(73) Assignee: EMC Corporation, Hopkinton, MA (US)

( * ) Notice: Subject to any disclaimer, the term of this patent is extended or adjusted under 35 U.S.C. 154(b) by 428 days.

(21) Appl. No.: 14/231,155

(22) Filed: Mar. 31, 2014

(51) Int. Cl.
   *H05K 5/00*    (2006.01)
   *H05K 7/20*    (2006.01)
   *F24F 11/00*   (2018.01)

(52) U.S. Cl.
   CPC ...... *H05K 7/20709* (2013.01); *F24F 11/0001* (2013.01); *F24F 11/0017* (2013.01); *H05K 7/20209* (2013.01)

(58) Field of Classification Search
   CPC .............. F24F 11/0001; F24F 11/0017; H05K 7/20709; H05K 7/20745; H05K 7/20209
   USPC ....................................................... 454/184
   See application file for complete search history.

(56) References Cited

U.S. PATENT DOCUMENTS

| | | | | |
|---|---|---|---|---|
| 6,711,470 B1* | 3/2004 | Hartenstein | .......... | F24F 11/0017 236/49.3 |
| 7,170,745 B2* | 1/2007 | Bash | .................. | H05K 7/20745 165/80.3 |
| 7,434,413 B2* | 10/2008 | Wruck | ................. | F24F 11/0017 165/251 |
| 7,682,234 B1* | 3/2010 | Beitelmal | ............ | F24F 11/0001 361/695 |
| 7,726,186 B2* | 6/2010 | Nair | ........................ | G01F 1/684 340/607 |
| 8,218,322 B2* | 7/2012 | Clidaras | .................... | G06F 1/20 165/80.4 |
| 8,721,409 B1* | 5/2014 | Morales | ............. | H05K 7/20209 454/184 |
| 9,109,989 B2* | 8/2015 | Hamann | ................ | G01N 17/04 |
| 2002/0072322 A1* | 6/2002 | Sharp | ................... | F24F 11/0001 454/229 |
| 2002/0144537 A1* | 10/2002 | Sharp | ....................... | G01N 1/26 73/31.01 |
| 2004/0253918 A1* | 12/2004 | Ezell | .................... | F24F 11/0017 454/239 |
| 2006/0154596 A1* | 7/2006 | Meneely, Jr. | ........ | F24F 11/0017 454/256 |

(Continued)

*Primary Examiner* — Steven B McAllister
*Assistant Examiner* — Jonathan Cotov
(74) *Attorney, Agent, or Firm* — Krishnendu Gupta

(57) ABSTRACT

Example embodiments of the present invention relate to a method, a system, and a computer program product for controlling conditions of an input air stream. The method includes detecting air quality conditions as environmental input variables of an input air stream and determining whether to take corrective action on the air quality conditions of the input air stream according to the environmental input variables. An output variable then may be controlled to affect the air quality conditions of the input air stream.

15 Claims, 7 Drawing Sheets

(56) References Cited

U.S. PATENT DOCUMENTS

| | | | |
|---|---|---|---|
| 2006/0199518 A1* | 9/2006 | Spiegel | A61G 10/023 454/238 |
| 2007/0213000 A1* | 9/2007 | Day | H05K 7/20745 454/184 |
| 2009/0156114 A1* | 6/2009 | Ahladas | H05K 7/20745 454/184 |
| 2010/0154448 A1* | 6/2010 | Hay | G06F 1/20 62/175 |
| 2010/0304657 A1* | 12/2010 | Gallmann | G06F 1/20 454/184 |
| 2011/0036107 A1* | 2/2011 | Muir | H05K 7/20827 62/89 |
| 2011/0195652 A1* | 8/2011 | Smith | F24F 11/008 454/184 |
| 2011/0239683 A1* | 10/2011 | Czamara | H05K 7/20745 62/259.4 |
| 2012/0171943 A1* | 7/2012 | Dunnavant | H05K 7/20745 454/184 |
| 2012/0196524 A1* | 8/2012 | Williams | F24F 1/00 454/256 |
| 2013/0054032 A1* | 2/2013 | El-Essawy | G01D 21/00 700/275 |
| 2014/0340842 A1* | 11/2014 | Towner | F24F 6/02 361/679.48 |

\* cited by examiner

METHOD AND SYSTEM FOR AIR CONTAMINATION ANALYSIS FOR FREE AIR COOLED DATA CENTERS

A portion of the disclosure of this patent document may contain command formats and other computer language listings, all of which are subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

This application relates to detection and remediation of air contaminants.

BACKGROUND

Thermal management of electronic cabinets traditionally was achieved by air flow in the A/C controlled environment. Recently, many customers started to apply fresh air cooling systems with no control over temperature and humidity. The American Society of Heating, Refrigerating and Air-Conditioning Engineers (ASHRAE) recommends for IT data centers allowable temperature/humidity envelope in the range of 15 to 32° C. (59-90° F.) and 20-80% RH respectively. As a result of free air cooling application, ASHRAE points two primary objectives for data centers: reliability and energy efficiency. Because some geographic areas are characterized by relatively high temperature and humidity of air, it can significantly reduce service life of data systems due to thermal derating and corrosion due to presents of chemically active contaminants in humid air.

Many computer and telecommunication rooms rely on forced air convection to cool the electronic Information Technology (IT) equipment. The power density of the IT equipment has continued to increase, thus requiring more air to cool the equipment. The quality of the air often is not monitored and certain combinations of chemical species along with higher temperature and humidity can accelerate metal corrosion. Certain geographic areas around the world have high concentrations of oxidizers (NO2, O3), sulfur dioxide and other impurities in the air. The increased use of "free cooling" brings outside air directly into the data center, which could be high in impurities and accelerate corrosion rates with the electronic equipment.

Most of the electronic IT equipment available today is designed to be lower cost and made on high volume, robotic assembly lines. The smaller components and increased pitch along with less protective solder mask and cheaper materials exacerbate the formation of creep corrosion. The corrosion can "bloom" and spread to adjacent pin signals and short circuit them. This can lead to hardware failures and potential "data unavailable" (DU), and in some instances "data loss" (DL) errors. To ensure fault tolerance, and serviceability levels, redundant equipment is often required, increasing costs and energy use. The higher failure rate, also leads to increased customer service replacement cost and maintenance.

SUMMARY

Example embodiments of the present invention relate to a method, a system, and a computer program product for controlling conditions of an input air stream. The method includes detecting air quality conditions as environmental input variables of an input air stream and determining whether to take corrective action on the air quality conditions of the input air stream according to the environmental input variables. An output variable then may be controlled to affect the air quality conditions of the input air stream.

BRIEF DESCRIPTION OF THE DRAWINGS

The above and further advantages of the present invention may be better under stood by referring to the following description taken into conjunction with the accompanying drawings in which.

DETAILED DESCRIPTION

Figure 1:
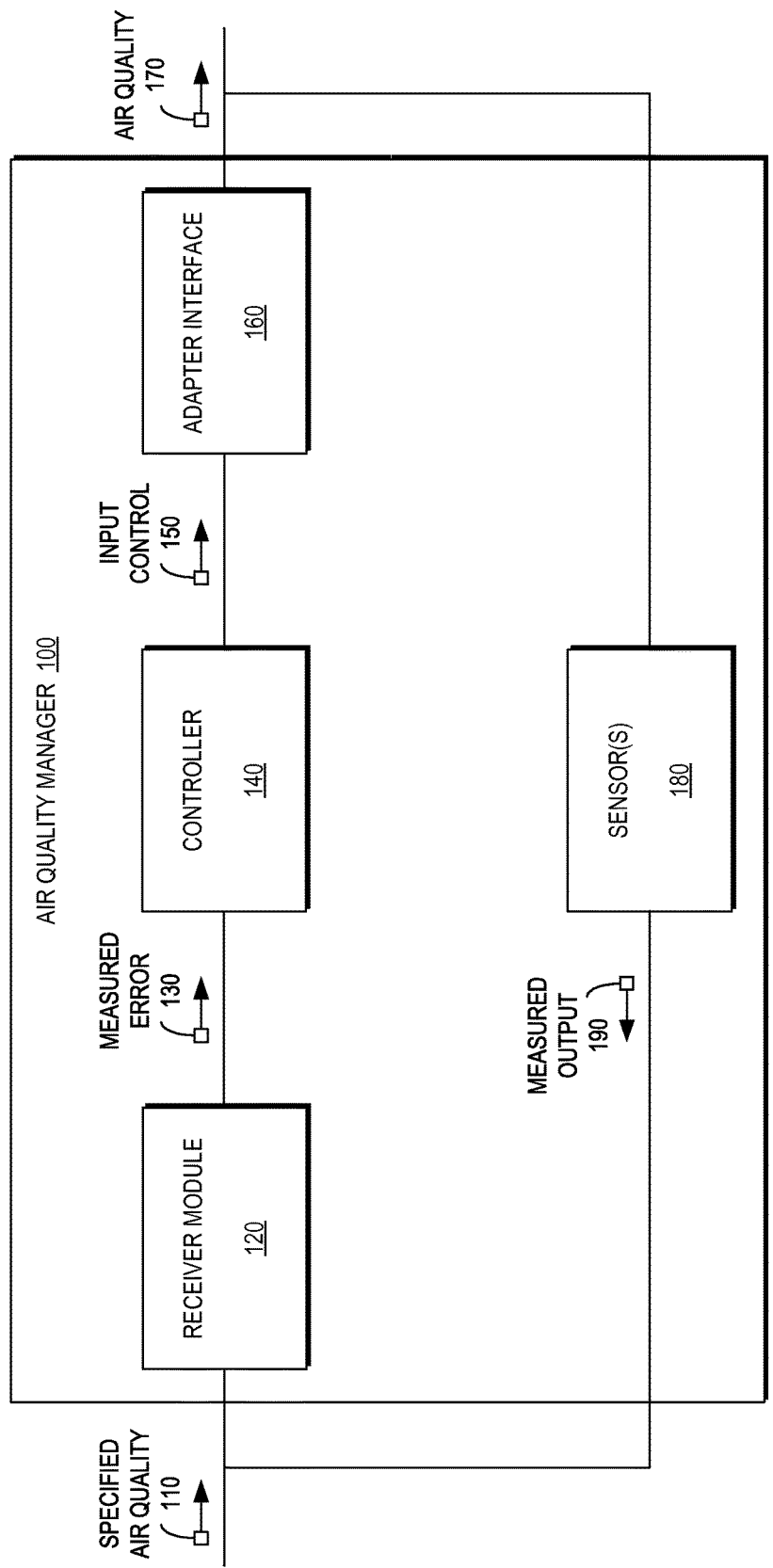
FIG. 1 is a flow diagram of an embodiment of a system process according to an example embodiment of the present invention.

Example embodiments of the present invention include a method for detecting and reporting levels of air impurities along with operating temperatures and relative humidity levels. The method comprises sending the environmental data from the sensor to the controller and comparing the value in a look up table or algorithm. The look up table or algorithm may be based on empirical material science corrosive experiments in a proprietary knowledge base. The knowledge base may be used to evaluate the environmental input variables and determine, using parameter sensitivity analysis, if the environment is corrosive and requires corrective action to adjust it to within acceptable limits. If so, the controller may direct an output action to provide counter measures to optimally reduce the corrosiveness in the air. If no action is required, the system may bypass the neutralization and decontamination process and continues to operate normally.

Example embodiments of the present invention include a neutralization and decontamination filter device that can clean, scrub, and add or remove chemical species as required to neutralize the air and to minimize the corrosiveness in the environment. A proprietary algorithm compares the environmental conditions from the sensors and determines which factors should be varied to efficiently adjust the air quality. The filter can use nanotechnology as well as electronic and mechanical filtering techniques to remove harmful impurities from the air. It can also add or remove moisture to the air and change temperature as required.

Example embodiments of the present invention include a method to control the temperature and relative humidity of the data center air to operate at optimal conditions for energy efficiency and mild corrosiveness. High temperatures and relative humidity can accelerate corrosiveness when in conjunction with other contaminants in the air. The sensor network is connected to a control unit that includes a microprocessor unit, which can control the computer room air conditioner units (CRAC). The CRAC units may operate normally to maintain desired room settings, but when subjected to high air contaminants, can also be set to run at lower temperatures and humidity levels when needed. The individual CRAC units can also be controlled separately by zones to provide higher granularity of efficiency.

In certain embodiments, the sensor data may be imported, uploaded, and read on commonly available infrastructure hardware and software. The sensor data also may be logged and stored for historical trends and future projections. The communication network may be Ethernet LAN, Fiber channel, wireless, or other communications means known in the art.

In certain embodiments, the air quality data can be stored and used to verify and substantiate warranty claims with original equipment manufacturers. Many manufacturers have their own acceptable environmental requirements. A sensor may be placed on or near each desired piece of equipment to provide ongoing verification of environmental compliance. Specific areas in the room may be controlled to tighter specifications providing flexibility to meet manufacturers requirements, desired reliability tradeoffs, and energy efficiency. The environments can be controlled to meet specifications such as given in ISA 71.04.

In certain embodiments, the controller may vary the external air damper to permit outside air to enter the building for "free cooling". If the external air sensor detects high levels of corrosive species and determines that the conditions are out of acceptable limits, it may govern the damper and prevent outside air from entering the building. In other embodiments, the outside air entering through the damper may be pre-conditioned directly into the neutralization and decontamination device prior to being mixed with internal air. It can also be directed into an auxiliary gas filtration device to further condition and pre-clean the air prior to mixing with internal air. In certain cases, the air may also need the temperature and relative humidity raised or lowered prior to entering the building.

The problem of IT equipment corrosion is a growing concern around the world, especially in developing countries that have higher amounts of air pollution. Thermal management of electronic cabinets traditionally was achieved by air flow in the A/C controlled environment. However, data centers are being legislated to reduce energy consumption and have begun to employ "free cooling", which involves bringing outside, unfiltered air directly in to cool the equipment. While this enables the chillers in the air conditioning equipment to be shut down, thus saving energy, the unfiltered air, however, can increase the likelihood of added contaminants and humidity that can harm IT equipment.

The American Society of Heating, Refrigerating and Air-Conditioning Engineers (ASHRAE) recommends for IT data centers allowable temperature/humidity envelope in the range of 15 to 32° C. (59-90° F.) and 20-80% RH respectively. As a result of free air cooling application, ASHRAE points two primary objectives for data centers: reliability and energy efficiency. Because some geographic areas are characterized by relatively high temperature and humidity of air, it can significantly reduce service life of data systems due to thermal derating and corrosion due to presents of chemically active contaminants in humid air.

Most chemically active species can present in the air or can react with PCB components only at relatively high humidity. ASHRAE recently started global research of the issue using copper and silver corrosion test coupons to determine intensity of corrosion; however, the composition of chemically active contaminants in the air is not detected. Further, while there are sensors available to detect air contaminants, typically these sensors can be used for calculation of presence one contaminant only.

A first type of sensor is based on detection of mass change in a metal coated quartz oscillator disc. Oxides on the metal surface of the resonance cell gain mass and lower the cell's resonance frequency. This type of sensor shows metal surface degradation, but does not give any information regarding nature of contamination.

A second type of sensor is based on the electrical resistance change of a corroded metal film. A change of electrical resistance due to corrosion is detected by comparison of voltage on air exposed and covered with protecting coating copper lines.

Recently, air quality sensor for IT rooms became available that are claimed to be able to detect up to 30 air contaminates, including combustibles, such as methane, ethane, iso-butane, propane, ethylene, hydrogen, and methyl ether; volatile organic compounds, such as acetone, methanol, n-pentane, n-hexane, benzene, methyl ethyl ketone, dimethyl amine, ethanol, and methyl acetate; hydrocarbons, such as vinyl chloride methyl chloride, methylene chloride ethylene oxide, and acryonitrite; and other gases and contaminants, such as hydrogen sulfide, carbon monoxide, sulfur dioxide, carbon dioxide, chlorine, ammonia, various freons, formaldehyde, and tobacco smoke. The sensing element in this sensor is comprised of a metal oxide semiconductor layer formed on the alumina substrate of a sensing chip together with an integrated heater. However, its output signal shows only percent of air contamination without distinguishing between different air contaminant species.

FIG. 1 is a flow diagram of an embodiment of a system process according to an example embodiment of the present invention. Example embodiments of the present invention include a system for air contamination analysis for data centers with application of free air cooling at areas where corrosive contaminants are present. As illustrated in FIG. 1, the system can be depicted as a closed loop feedback flow chart. The desired air quality inside the building, for example, can be specified 110 as the limit to reference to. This can be generally accepted standards such as ISA-71.04 or other user determined air quality or corrosion levels. Air sensors 180 measure the air quality and contaminant level in the room and send the measured output signal 190 to a receiver module 120. The receiver module 120 may receive the specified air quality 110 and the measured air quality 190 as an environmental input variable and determine a measured error 130 between the specified air quality 110, and the measured output signal 190. A controller 140 then may determine whether to take corrective action on the air quality conditions of the input air stream according to the environmental input variables specified air quality 110, measured output signal 190. An adapter interface 160 then may control an output variable to affect the air quality conditions 170 of the input air stream.

Figure 2:
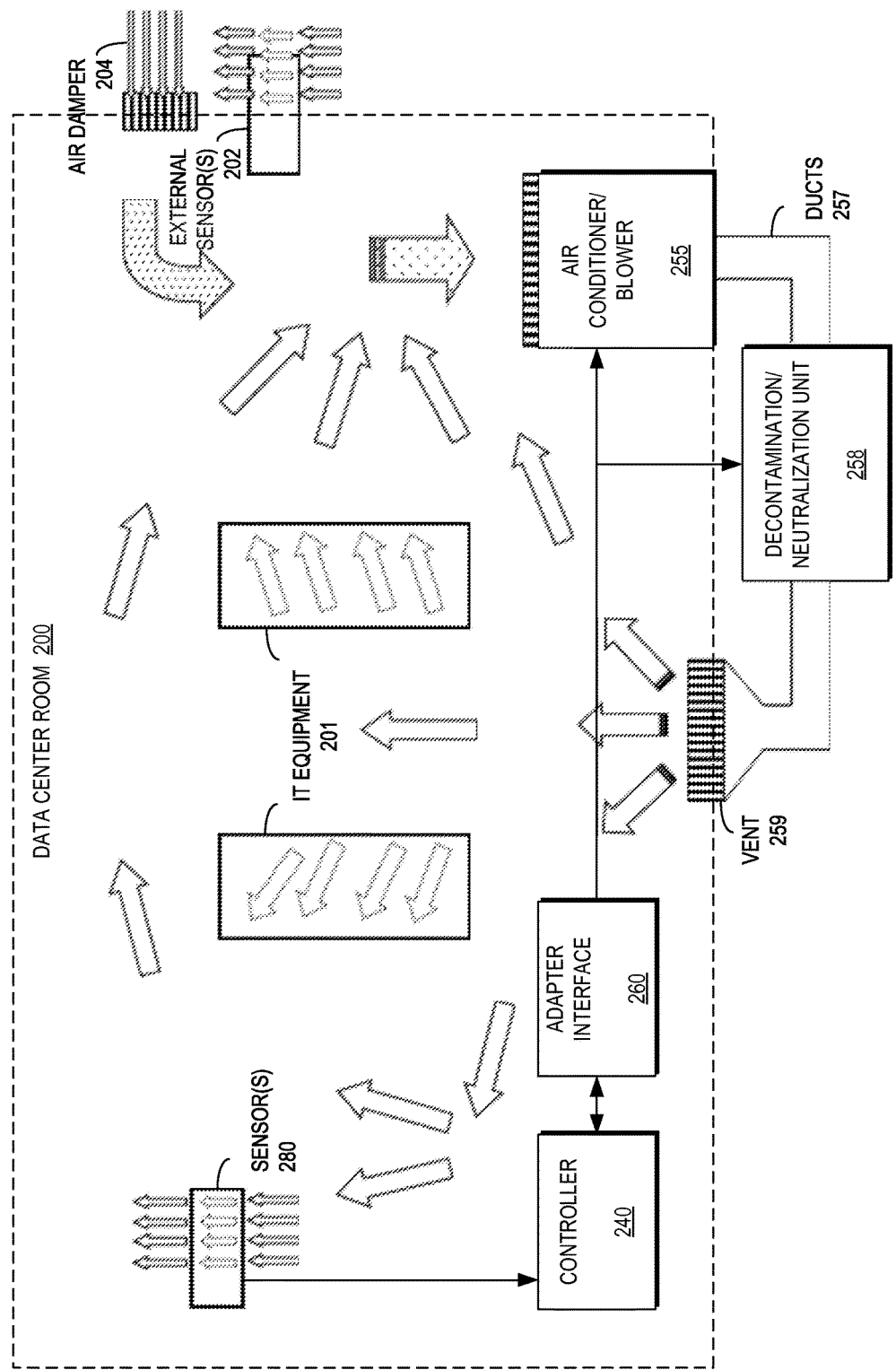
FIG. 2 is a block diagram of a data center room according to an example embodiment of the present invention.

FIG. 2 is a cross-sectional block diagram of a typical data center room 200 according to an example embodiment of the present invention. As illustrated in FIG. 2, an air sensor 280 may be wall or cabinet mounted in the data center room 200. The air sensor 280 may be configured to sample the internal air, detecting temperature, humidity, and the presence of chemically active contaminations (e.g., oxidizers (NO2, O3), reduced sulfides (SO), sulfur dioxide (SO2) and other impurities). The sensor 280 may transfer these readings to a controller 240 configured to read the data from the sensor 280 and determine whether the data is within acceptable limits or not. In certain embodiments, the controller 240 may log and store the data from the sensor 280.

The controller 240 may be configured to communicate and control the operation of an air handling system for the data center room 200. An adapter interface 260 may connect signals from air handler 255 and filter 258 devices, as well as other peripheral devices 202, 204, to the controller 240. This enables the controller 240 to connect to existing infrastructure devices. The controller 240 also may communicate to infrastructure monitoring software (not shown) via a LAN connection and other protocols, including wireless communication.

Depending on the outcome of the sensor 280 measurements, the controller 240 may direct the peripheral devices 202, 204, 255, 258, 259 to take corrective action and attempt to bring the air quality back to acceptable limits. The controller 240 may change the operating settings of the air conditioner 255 to change the temperature and/or the humidity. If the room 200 has no CRAC unit and a separate air conditioning scheme, a blower device 255 may be substituted to pressurize and move air within the room. Example embodiments of the present invention also may be installed in rooms that have their own separate or preexisting temperature and humidity controls.

The air chemical decontamination/neutralization (ACDN) unit 258 is generally installed downstream of the CRAC unit 255 and receives high pressure, high volumetric air flow. This helps ensure air circulating in the room is subjected to sequestration and helps to reduce the effects of any pressure drop across the device. The controller 240 sends signals to the ACDN 258 to turn on and activate certain chambers to cleanse identified impurities from the air. In the normal off position, the ACDN 258 may include a bypass chamber that provides no decontamination or neutralization of the air. In rooms with their own air conditioning controls, the ACDN 258 may run independently.

In certain embodiments, an additional air sensor 202 may be installed on the outside of the room 200 to monitor external air quality. Should the air quality be inferior, a warning message may be issued and the controller 240 may limit or prevent the external damper 204 from opening, depending on customer-set limits. If the air quality is deemed acceptable, the controller 240 may enable outside air or "free cooling" techniques to be used. In some cases, the external air can also be pre-conditioned or cleaned prior to entering the room 200, thus enabling "free cooling" without the potential harmful effects of impurities or humidity.

Figure 3:
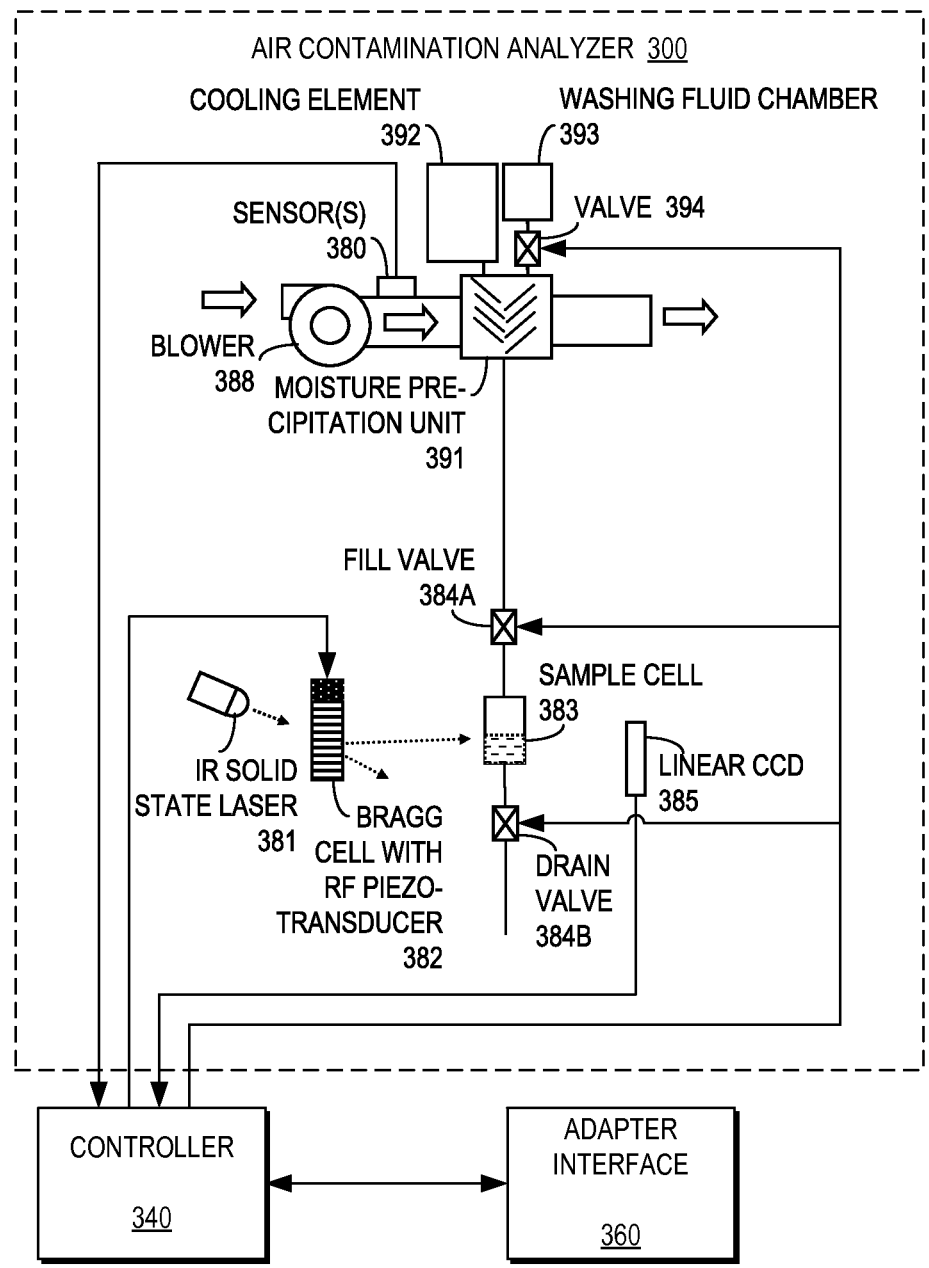
FIG. 3 is a schematic diagram of an air contamination analyzer according to an example embodiment of the present invention.

FIG. 3 is a schematic diagram of an air contamination analyzer 300 according to an example embodiment of the present invention. As illustrated in FIG. 3, the analyzer may periodically collect moisture from the air into a sample cell 383 by condensing the moisture in a moisture precipitation unit 391. A blower 388 may pass air over a cooling element 392, thereby causing it to condense. A sensor 380 also may detect contaminants in the air as it is moved by the blower 388. The collected moisture in the sample cell 383 may be positioned between a Bragg cell, acousto-optic filter 382 and a linear CCD 385 which are part of the acousto-optic spectrometer. Chemical composition of contaminants presented in the collected moisture in the sample cell 383 may be analyzed at the controller 340 based on a spectral absorption curve and it's comparison with spectral curves from a data base. A level of contamination may be calculated based on data of air humidity, temperature, and air velocity flowing through the moisture precipitation unit 391. The adapter interface 360 then may control the environmental variables as described above with respect to FIG. 2.

The air contamination analyzer 300 also may include a fill valve 384A to control the flow of the condensed moisture from the moisture precipitation unit 391 into the sample cell 383 and a drain valve to drain condensed moisture and washing fluid from the sample cell 383. A washing fluid chamber 393 may store washing fluid, the flow of which may be controlled by a valve 394, to wash contaminants from the moisture precipitation unit 391 and the sample cell 383.

Figure 4:
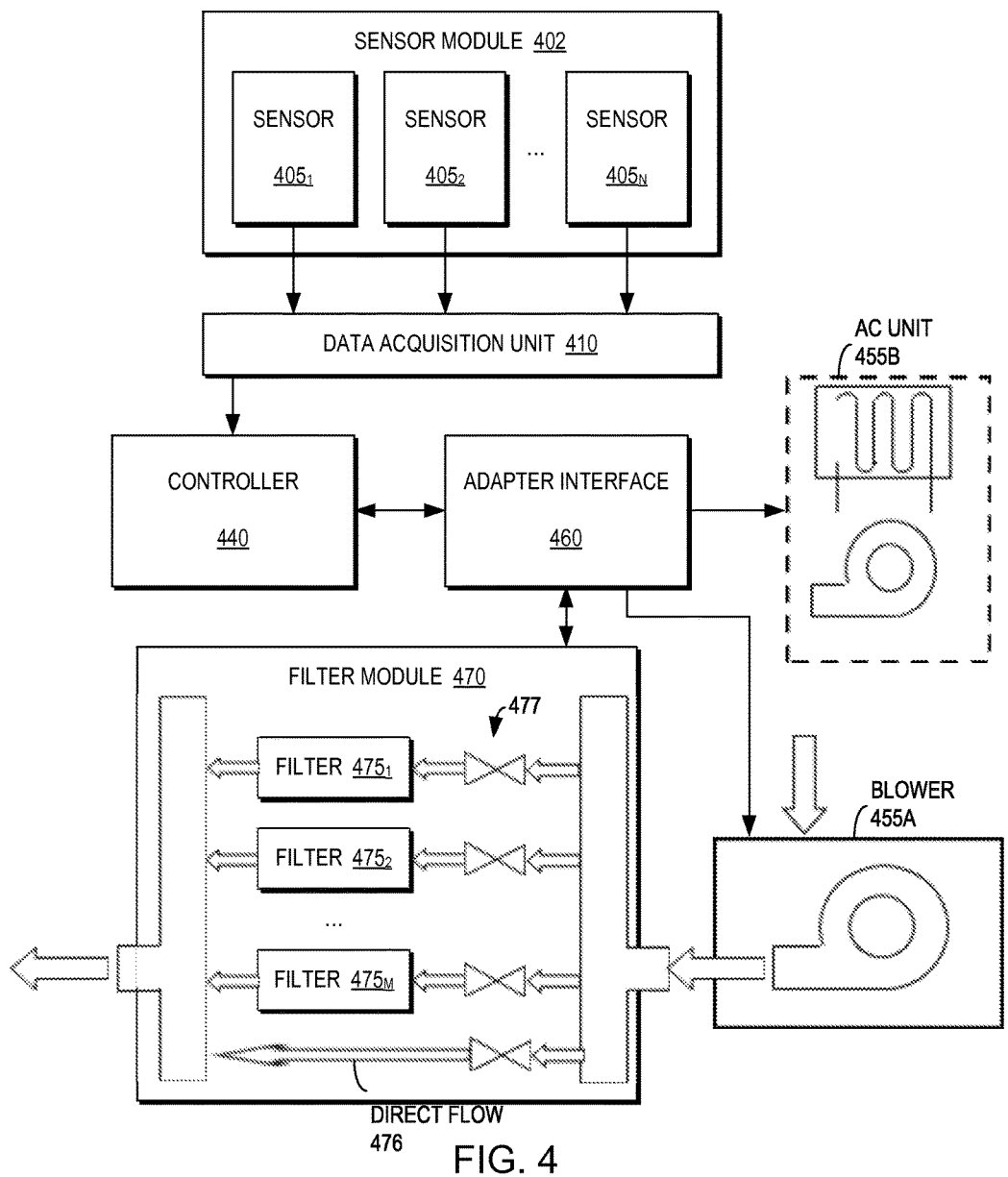
FIG. 4 is a schematic diagram of communication between a plurality of sensors, a controller, and an adapter interface according to an example embodiment of the present invention.

FIG. 4 is a block diagram of a schematic representation of communications between sensors $405_1$-$405_N$ (405 generally), controller 440, air circulation 455A, 455B and filter 470 units. A sensor module 402 may be comprised of a plurality of sensors 405 that are capable of detecting air temperature, humidity levels, and low concentration levels of corrosive active contaminants, such as oxidizers (NO2, O3), sulfur dioxide and other impurities. A data acquisition unit 410 may convert analog signals from the sensors 405 into digital numeric values and transfers them to the controller 440. The controller 440 may analyze the data and determine if any corrective action is required. Signals may then be sent to the adapter interface 460, which may directly adjust the blower 455A and/or the air conditioning unit 455B, and the air filter module 470. The air filter module 470 may be comprised of a plurality of filters $475_1$-$475_M$ (475 generally) that may each be tailored to a particular contaminant, such as an $NO_X$ filter, an $SO_X$ filter, and a $H_2S$ filter. Each filter 475 may be individual controller by a valve. In certain embodiments, if no contaminants are detected, the air may flow through a direct flow 476.

Figure 5:
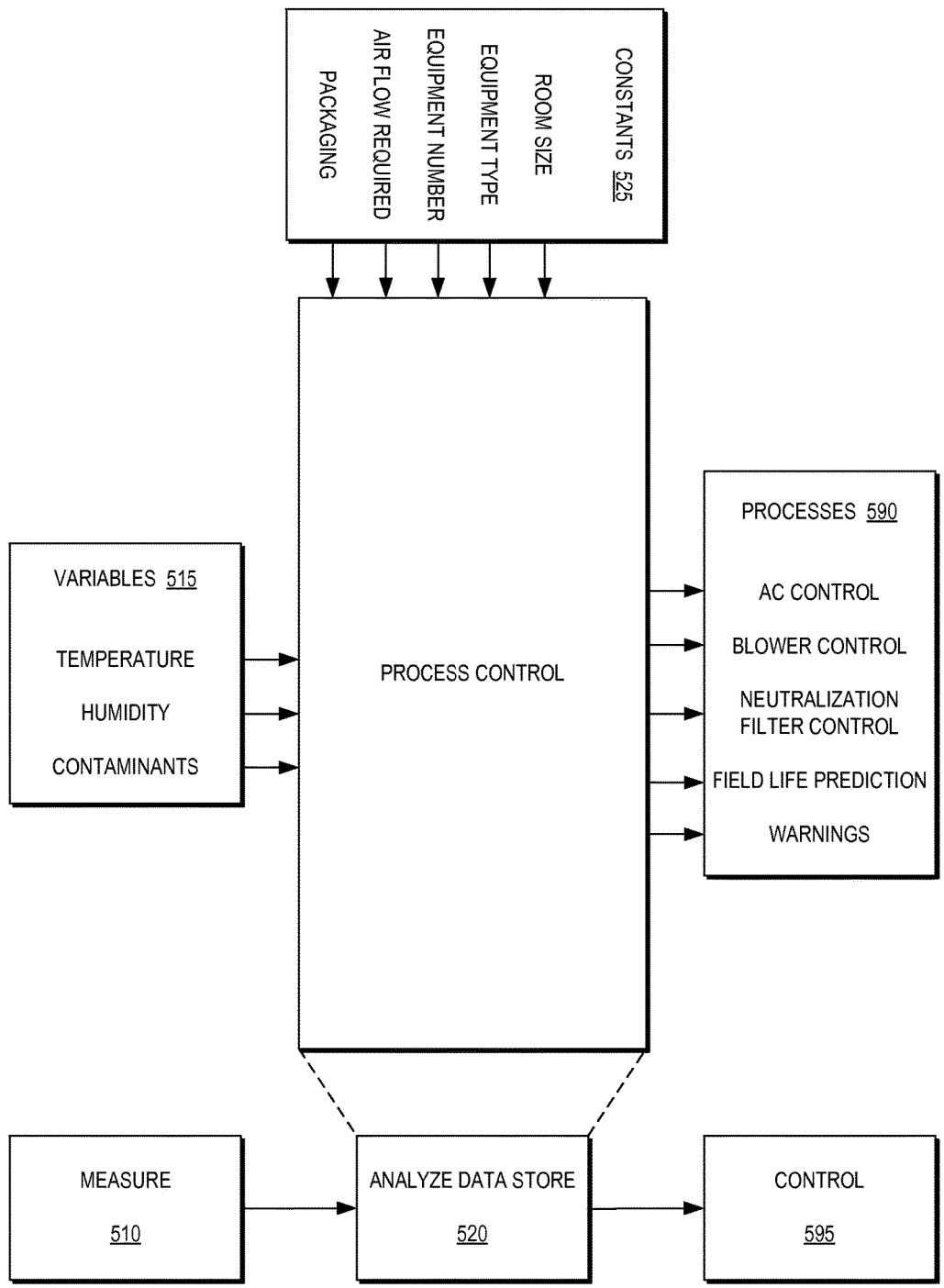
FIG. 5 is a process control diagram illustrating input and output of a method according to an example embodiment of the present invention.

FIG. 5 is a block diagram of a process control diagram of an air purification system according to an example embodiment of the present invention. First, sensors may measure (520) the environmental variables. This includes the physical air variables 515 (e.g., temperature, humidity, and contaminants) and independent constants 525 (e.g., room size, equipment type, equipment number, air flow required, and packaging) that make up the input factors. The controller then may compare the input factors against empirical material science, such as from a data store (520). The output of these input factors are the controlled processes 590 (e.g., AC control, blower control, neutralization filter control, field life prediction, and warnings), which enable the air purification system to self correct in a negative feedback process. The adapter interface then may control (595) the controlled processes according to the analysis.

Figure 6:
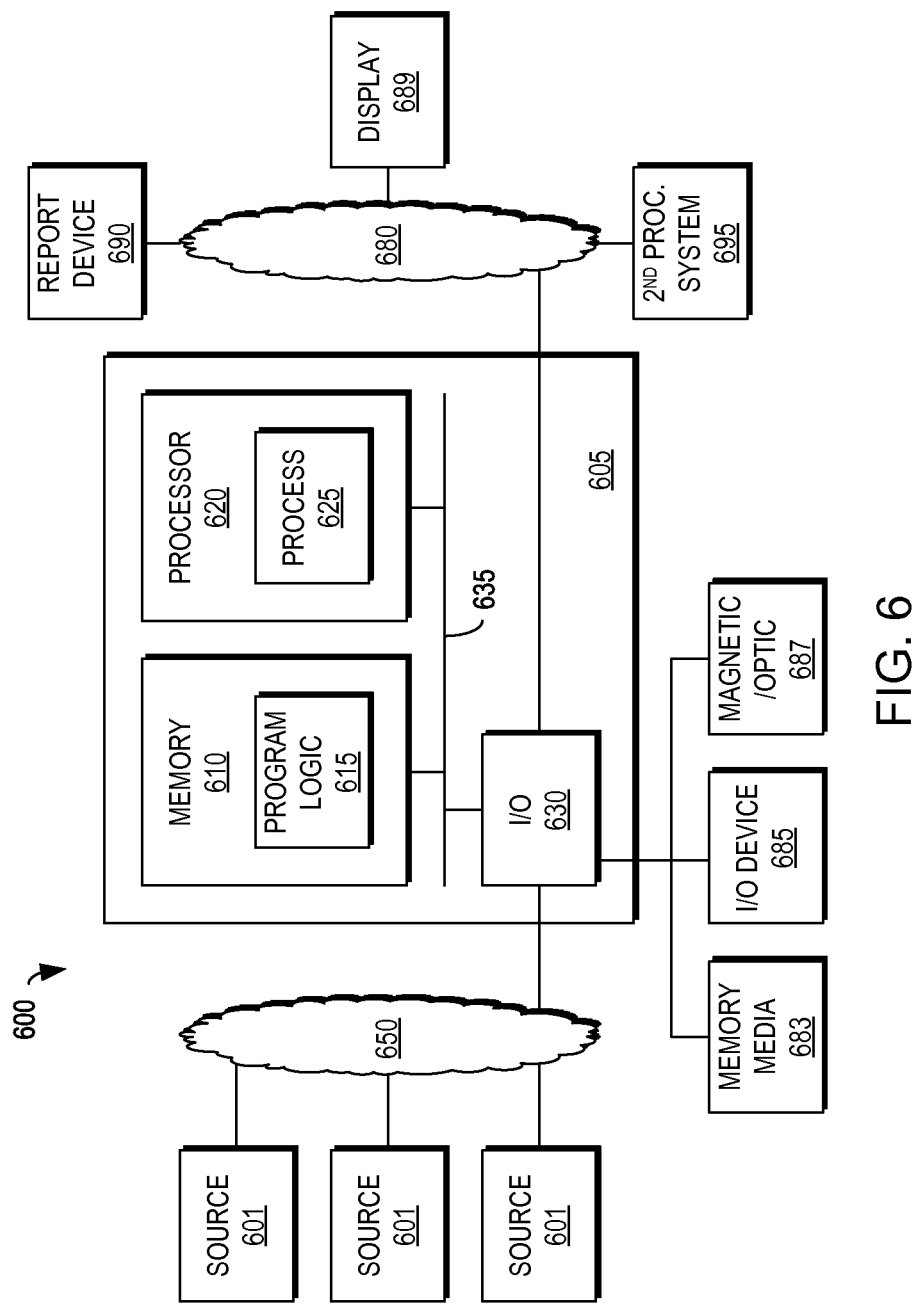
FIG. 6 is a block diagram of an apparatus according to an example embodiment of the present invention.

FIG. 6 is a block diagram of an example embodiment apparatus 605 according to the present invention. The apparatus 605 may be part of a system 600 and includes memory 610 storing program logic 615, a processor 620 for executing a process 625, and a communications I/O interface 630, connected via a bus 635.

The methods and apparatus of this invention may take the form, at least partially, of program code (i.e., instructions) embodied in tangible non-transitory media, such as floppy diskettes, CD-ROMs, hard drives, random access or read only-memory, or any other machine-readable storage medium. When the program code is loaded into and executed by a machine, such as the computer of FIG. 6, the machine becomes an apparatus for practicing the invention. When implemented on one or more general-purpose processors, the program code combines with such a processor to provide a unique apparatus that operates analogously to specific logic circuits. As such, a general purpose digital machine can be transformed into a special purpose digital machine.

Figure 7:
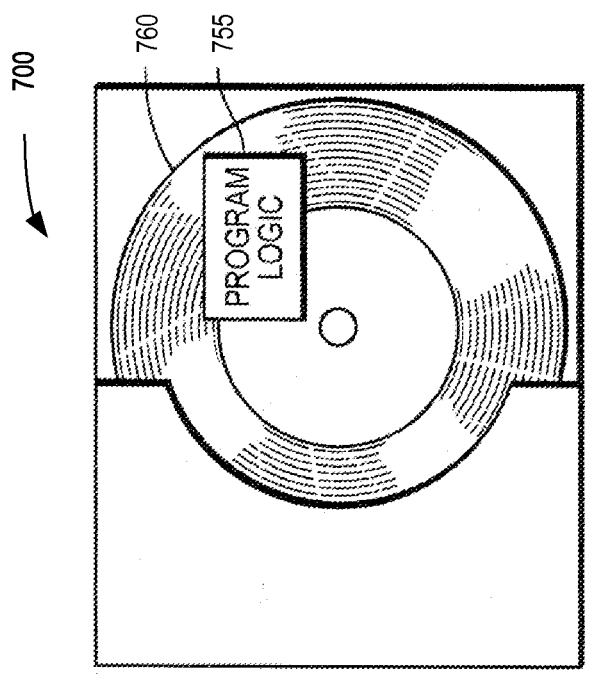
FIG. 7 is a diagram of a computer program product according to an example embodiment of the present invention.

FIG. 7 shows program logic 755 embodied on a computer-readable medium 760 as shown, and wherein the logic 755 is encoded in computer-executable code configured for carrying out the methods of this invention, thereby forming a computer program product 700.

The logic for carrying out the method may be embodied as part of the aforementioned system, which is useful for carrying out a method described with reference to embodiments shown. For purposes of illustrating the present invention, the invention is described as embodied in a specific configuration and using special logical arrangements, but one skilled in the art will appreciate that the device is not limited to the specific configuration but rather only by the claims included with this specification.

Although the foregoing invention has been described in some detail for purposes of clarity of understanding, it will be apparent that certain changes and modifications may be practiced within the scope of the appended claims. Accordingly, the present implementations are to be considered as illustrative and not restrictive, and the invention is not to be limited to the details given herein, but may be modified within the scope and equivalents of the appended claims.

What is claimed is:

1. A method comprising:
   detecting air quality conditions as environmental input variables of an input air stream, wherein detecting air quality conditions comprises receiving data from a plurality of sensors associated with respective pieces of equipment to monitor the air quality conditions to which the respective pieces of equipment are subject;
   determining whether to take corrective action on the air quality conditions of the input air stream based at least in part on at least one environmental input variable;
   controlling an output variable to affect the air quality conditions of the input air stream;
   logging in a first data store a first time-series history of at least a portion of the detected air quality conditions;
   verifying, based at least in part on the time-series history, ongoing compliance with at least one predetermined environmental requirement
   storing in a second data store a second time-series history of air quality conditions from the plurality of sensors;
   determining, based at least in part on information stored in a third data store, at least one environmental condition requirement specified by at least one manufacturer of at least one piece of the equipment;
   comparing at least one of the first and second stored time-series histories of air quality conditions against at least one stored environmental condition requirement; and
   based at least in part on the comparison between the at least one of the first and second stored time-series history of air quality conditions and the stored environmental condition requirements, logging, in a fourth data store, air quality data configured to substantiate a warranty claim with the manufacturer of the at least one piece of equipment.

2. The method of claim 1 wherein determining whether to take corrective action on the air quality conditions of the input air stream according to the environmental input variables comprises performing an analysis on the environmental input variables according to empirical material science data.

3. The method of claim 2 wherein performing an analysis on the environmental input variables according to empirical material science data comprises:
   evaluating the environmental input variables; and
   determining whether one or more of the environmental input variables is indicative of whether corrective action is necessary to affect one or more of the air quality conditions of the input air stream to be within acceptable limits.

4. The method of claim 3 wherein controlling an output variable to affect the air quality conditions of the input air stream comprises controlling countermeasures to affect the one or more air quality conditions of the input air stream to be within acceptable limits.

5. The method of claim 3 wherein controlling an output variable to affect the air quality conditions of the input air stream comprises redirecting the input air stream to a decontamination filter configured to affect the air quality conditions of the input air stream according to the environmental input variables.

6. The method of claim 1 wherein controlling an output variable to affect the air quality conditions of the input air stream comprises controlling the output variable to affect the air quality conditions of the input air stream to which a respective piece of equipment is subject.

7. The method of claim 1 further comprising reporting results of controlling the output variable to monitoring software.

8. A system comprising:
   a sensor configured to detect air quality conditions of an input air stream;
   a receiver module configured to receive the air quality condition as environmental input variables, wherein the receiver module is further configured to receive data from a plurality of sensors associated with respective pieces of equipment to monitor the air quality conditions to which the respective pieces of equipment are subject, and to store, in a second data store, a second time-series history of air quality conditions from the plurality of sensors;
   a first data store configured to store a first time-series history of at least a portion of the detected air quality conditions;
   a controller in operable communication with the receiver module and the first data store, the controller configured to determine whether to take corrective action on the air quality conditions of the input air stream based at least in part on at least one environmental input variable and to verify based at least in part on the time-series history, ongoing compliance with at least one predetermined environmental requirement, wherein the controller is further configured to determine, based at least in part on information stored in a third data store, at least one environmental condition requirement specified by at least one manufacturer of at least one piece of the equipment, compare at least one of the first and second time-series histories of air quality conditions against at least one stored environmental condition requirement, and log in a fourth data store information configured to substantiate a warranty claim with the manufacturer of the at least one piece of equipment;

an adapter interface in operable communication with the controller, the adapter interface configured to control an output variable to affect the air quality conditions of the input air stream.

9. The system of claim 8 wherein the controller is further configured to perform an analysis on the environmental input variables according to empirical material science data.

10. The system of claim 9 wherein the controller is further configured to evaluate the environmental input variables and determine whether one or more of the environmental input variables is indicative of whether corrective action is necessary to affect one or more of the air quality conditions of the input air stream to be within acceptable limits.

11. The system of claim 10 wherein the adapter interface is further configured to control countermeasures to affect the one or more air quality conditions of the input air stream to be within acceptable limits.

12. The system of claim 10 wherein the adapter interface is further configured to redirect the input air stream to a decontamination filter configured to affect the air quality conditions of the input air stream according to the environmental input variables.

13. The system of claim 8 wherein the adapter interface is further configured to control the output variable to affect the air quality conditions of the input air stream to which a respective piece of equipment is subject.

14. The system of claim 8 wherein the controller is further configured to report results of controlling the output variable to monitoring software.

15. A computer program product including a computer readable storage medium having computer program code encoded thereon that when executed by a processor of a computer causes the computer to control conditions of an input air stream, the computer program code comprising:

computer program code for detecting air quality conditions as environmental input variables of an input air stream, wherein detecting air quality conditions comprises receiving data from a plurality of sensors associated with respective pieces of equipment to monitor the air quality conditions to which the respective pieces of equipment are subject;

computer program code for determining whether to take corrective action on the air quality conditions of the input air stream based at least in part on at least one environmental input variable;

computer program code for controlling an output variable to affect the air quality conditions of the input air stream;

computer program code for logging in a first data store a first time-series history of at least a portion of the detected air quality conditions;

computer program code for verifying, based at least in part on the time-series history, ongoing compliance with at least one predetermined environmental requirement computer program code for storing in a second data store a second time-series history of air quality conditions from the plurality of sensors;

computer program code for determining, based at least in part on information stored in a third data store, at least one environmental condition requirement specified by at least one manufacturer of at least one piece of the equipment;

computer program code for comparing at least one of the first and second stored time-series histories of air quality conditions against at least one stored environmental condition requirement; and based at least in part on the comparison between the at least one of the first and second stored time-series history of air quality conditions and the stored environmental condition requirements, computer program code for logging, in a fourth data store, air quality data configured to substantiate a warranty claim with the manufacturer of the at least one piece of equipment.

\* \* \* \* \*